United States Patent
Speier

(10) Patent No.: US 9,995,809 B2
(45) Date of Patent: Jun. 12, 2018

(54) METHOD AND MAGNETIC RESONANCE APPARATUS FOR CREATING AT LEAST TWO IMAGE DATA SETS

(71) Applicant: Siemens Aktiengesellschaft, München (DE)

(72) Inventor: Peter Speier, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 567 days.

(21) Appl. No.: 14/644,657

(22) Filed: Mar. 11, 2015

(65) Prior Publication Data
US 2015/0260820 A1    Sep. 17, 2015

(30) Foreign Application Priority Data
Mar. 11, 2014   (DE) .................. 10 2014 204 448

(51) Int. Cl.
| G01R 33/483 | (2006.01) |
| G01R 33/561 | (2006.01) |
| G01R 33/565 | (2006.01) |

(52) U.S. Cl.
CPC ...... *G01R 33/4835* (2013.01); *G01R 33/5611* (2013.01); *G01R 33/5614* (2013.01); *G01R 33/56509* (2013.01)

(58) Field of Classification Search
CPC ............ G01R 33/4835; G01R 33/5611; G01R 33/5614; G01R 33/56509
See application file for complete search history.

(56) References Cited

U.S. PATENT DOCUMENTS

| 2008/0312526 A1* | 12/2008 | Gagnon | G01R 33/28 600/411 |
| 2010/0063380 A1 | 3/2010 | Duerk et al. | |
| 2010/0092056 A1* | 4/2010 | Rofsky | G01R 33/54 382/131 |

(Continued)

FOREIGN PATENT DOCUMENTS

| DE | 102008039203 A1 | 2/2010 |
| DE | 102011007823 A1 | 10/2012 |

OTHER PUBLICATIONS

Breuer, et al., "Controlled Aliasing in Volumetric Parallel Imaging (2D CAIPIRINHA)", Magentic Resonance in Medicine, vol. 55, pp. 549-556, (2006).

(Continued)

*Primary Examiner* — Rodney Bonnette
(74) *Attorney, Agent, or Firm* — Schiff Hardin LLP

(57) ABSTRACT

In a method and a magnetic resonance apparatus for generating at least two parallel two-dimensional image data sets of an examination object a multi-coil array radiates a multiband radiofrequency pulse that excites at least two slices, which are phase encoded by a phase encoding gradient. Scan signals produced by the excited slices are detected using each coil of the multi-coil array. In one of the excitation or the phase encoding, the phase of the scan signal in at least one slice is modulated such that the phase of the scan signal therefrom differs from the phase of the other slices. Image data sets are reconstructed based on the modulation of the phase of the scan signal in at least one slice.

13 Claims, 5 Drawing Sheets

(56) References Cited

U.S. PATENT DOCUMENTS

2013/0342200 A1    12/2013   Ugurbil
2014/0312898 A1    10/2014   Ullmann et al.

OTHER PUBLICATIONS

Breuer, et al., "Controlled aliasing in parallel imaging results in high- ation (CAIPIRINHA) for multi-slice imaging", Magnetic Resonance in Medicine, vol. 53, No. 3, pp. 684-691, (2005).
Derakhshan et al.: "Halting the Effects of Flow Enhancement With Effective Intermittent Zeugmatographic Encoding (HEFEWEIZEN) in SSFP", Journal of Magnetic Resonance Imaging, No. 29, pp. 1163-1174, (2009).
Wu et al; "Simultaneous Multislice Multiband Parallel Radiofrequency Excitation with Intermittent Slice-Specific Transmit B1 Homogenization "; Magnetic Resonance in Medicine; vol. 70; pp. 630-638; (2013).
Pruessmann et al., "SENSE: Sensitivity Encoding for Fast MRI," Magnetic Resonance in Medicine, vol. 42 (1999) pp. 952-962.
Setsompop et al., "Blipped-Controlled Aliasing in Parallel Imaging (blipped-CAIP) for simultaneous multi-slice EPI with reduced g-factor penalty," Magnetic Resonance in Medicine, vol. 67, No. 5 (2012), pp. 1210-1224.

\* cited by examiner

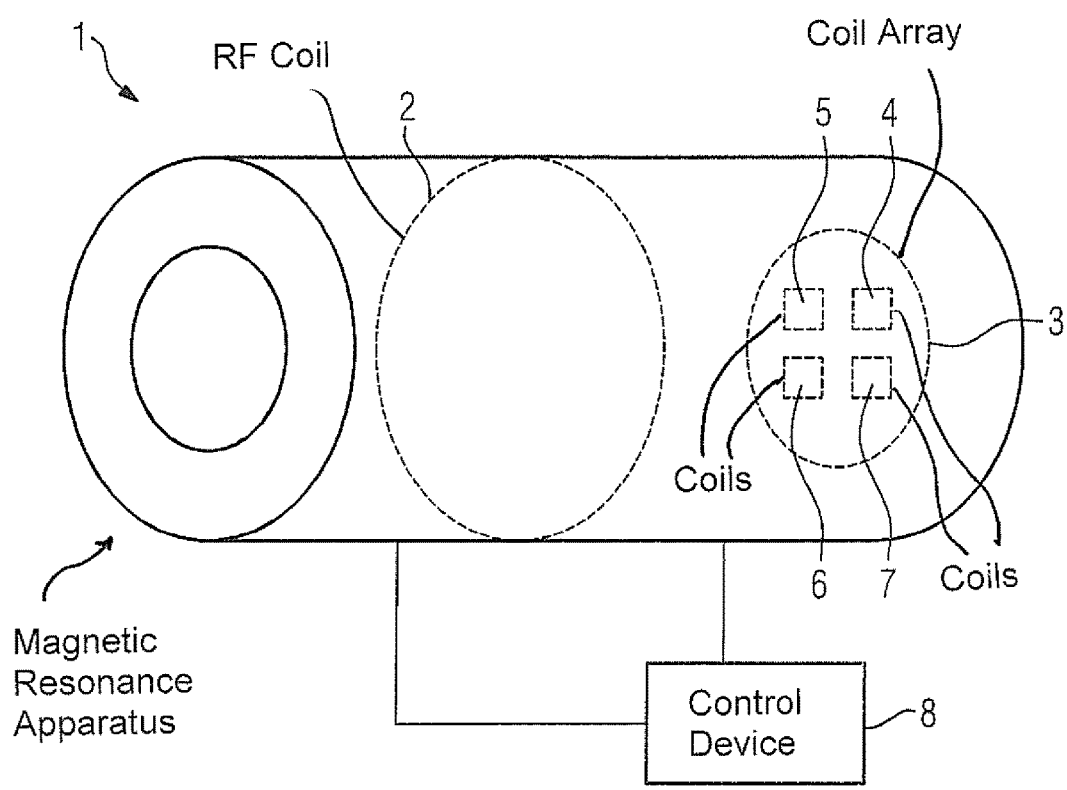

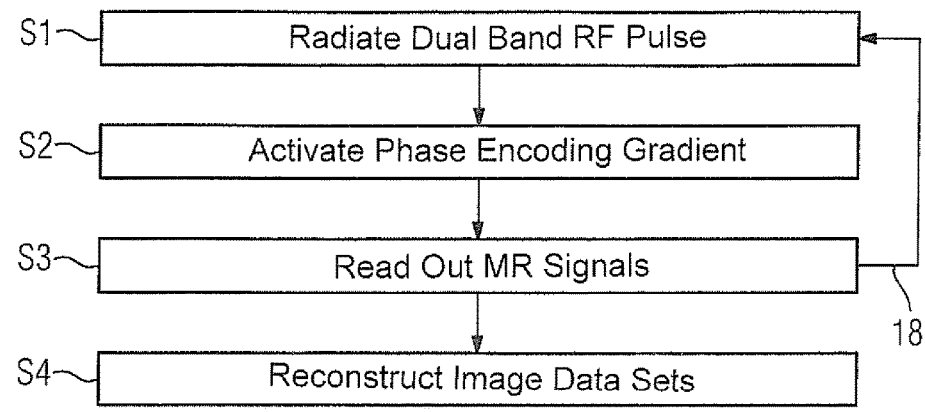
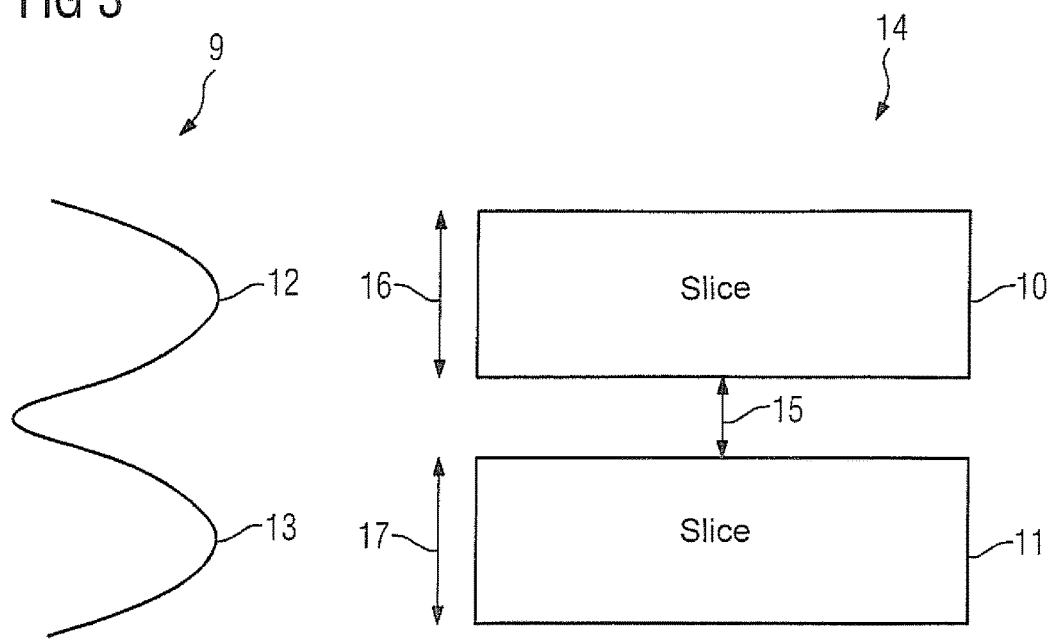

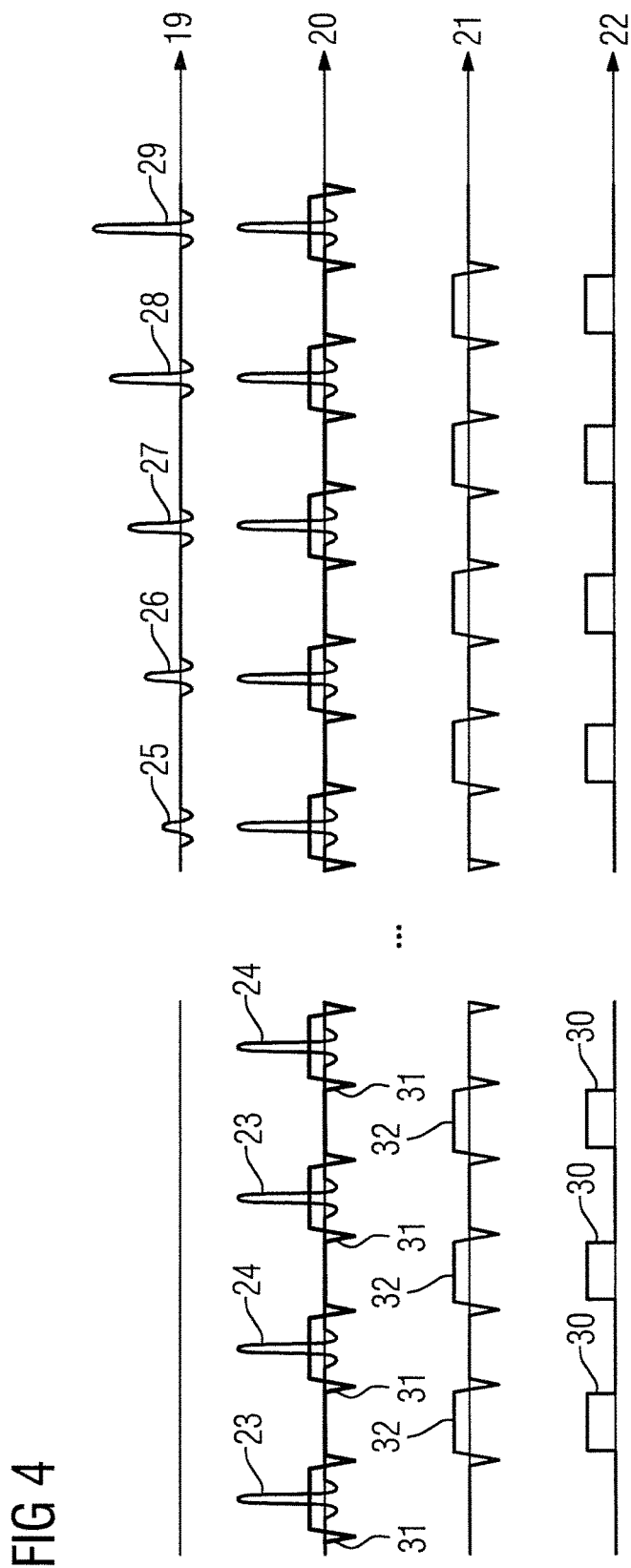

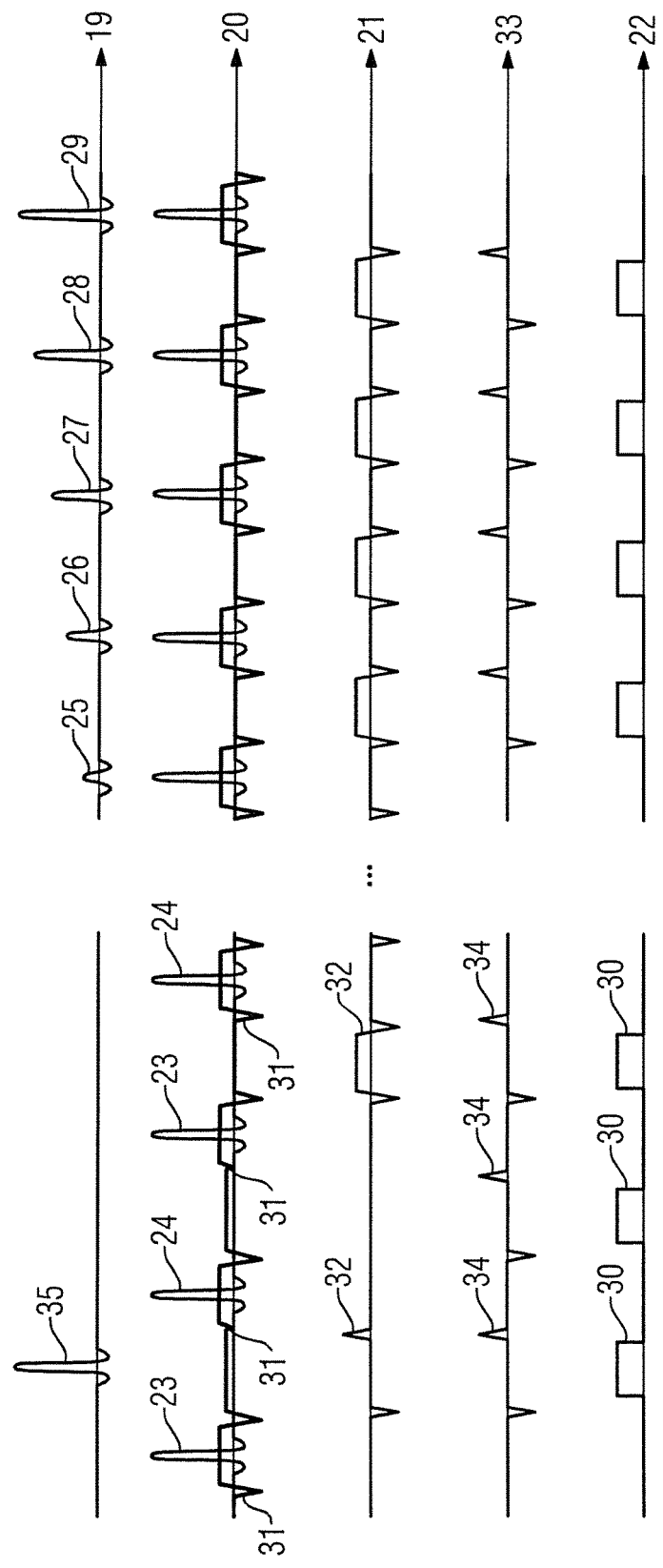

METHOD AND MAGNETIC RESONANCE APPARATUS FOR CREATING AT LEAST TWO IMAGE DATA SETS

BACKGROUND OF THE INVENTION

Field of the Invention

The invention concerns a method for creating at least two essentially parallel two-dimensional image data sets of a region of interest by operation of a magnetic resonance system having a coil array.

Description of the Prior Art

A basic problem for acquiring MR images is the scan time. This was initially reduced by software methods in the form of optimized pulse sequences, wherein the flip angle of the pulses, the number thereof, the setting of the gradients or the waiting times between individual sequence sections, was modified. It was thus possible to reduce the acquisition of a gradient echo image using the FLASH method from several minutes to a few seconds. Although this changes the contrast behavior, it remains T2*-dependent. The RARE method is well-known as a fast, spin echo based imaging method. Other methods such as GRASE or TrueFISP exist, which constitute a form of mixture of the basic methods.

In order to achieve a further reduction in the acquisition time, it has been proposed to use multiple coils for reading out the scan signal. Not all the k-space lines are acquired but only selected ones, but using the multiple coils. This is also known as undersampling. In order to prevent an aliasing artefact, i.e. foldover effects, that are caused by this procedure in the reconstructed image, different reconstruction algorithms are used that manage with fewer k-space lines and therefore the more time-consuming scanning (filling) of the k-space lines is unnecessary.

Such reconstruction methods are commonly referred to under the acronyms GRAPPA (GeneRalized Autocalibrating Partially Parallel Acquisition), SENSE (SENSitivity Encoding for fast MRI) and SMASH (SiMultaneous Acquisition of Spatial Harmonics).

In the case of SENSE, first presented in SENSE: sensitivity encoding for fast MRI. Pruessmann K P, Weiger M, Scheidegger M B, Boesiger P, Magn Reson Med., 42(5), 952-62, 1999, the coil sensitivities are measured and a pseudoinverse matrix is determined therefrom. Using this matrix, the acquired image data of all the coils is combined into a full image. In other words, the coil images are unfolded to produce a total view.

In the case of the GRAPPA reconstruction method, the missing k-space lines are reconstructed by determining a k-space line to be added from a number of scanned k-space, lines by mathematically shifting the measured signal in k-space.

These reconstruction methods are based on the fact that the coil sensitivities differ in the region of interest. In order to amplify or rather make optimum use of these sensitivity variations, several methods collectively referred to under the acronym CAIPIRINHA (Controlled Aliasing In Parallel Imaging Results IN Higher Acceleration) are known. These are based on the fact that the aliasings can be selectively varied during data acquisition.

In the case of MS-CAIPIRINHA (Felix A. Breuer, Martin Blaimer, Robin M. Heidemann, Matthias F. Mueller, Mark A. Griswold, and Peter M. Jakob: Controlled Aliasing in Parallel Imaging Results in Higher Acceleration for Multi-Slice Imaging, Magn. Res. Med. 53:684-691, 2005), two slices are excited by alternating dual band pulses.

2D-CAIPIRINHA (Felix A. Breuer, Martin Blaimer, Matthias F. Mueller, Nicole Seiberlich, Robin M. Heidemann, Mark A. Griswold, and Peter M. Jakob: Controlled Aliasing in Volumetric Parallel Imaging, Magn. Res. Med., 55:549-556, 2006) is based on improving sensitivity variations for three-dimensional imaging in the phase encoding directions then present in two spatial directions.

In blipped CAIPIRINHA (Blipped-Controlled Aliasing in Parallel Imaging for Simultaneous Multislice Echo Planar Imaging With Reduced g-Factor Penalty. Kawin Setsompop, Borjan A. Gagoski, Jonathan R. Polimeni, Thomas Witzel, Van J. Wedeen, and Lawrence L. Wald), the slice gradient is additionally switched in the form of blips, i.e. in an oscillating manner, during readout.

Although the sensitivity changes produced in CAIPIRINHA must be taken into account for the reconstruction methods, the usual and above mentioned methods, such as GRAPPA and SENSE, can be used. CAIPIRINHA changes the evaluation by the reconstruction taking place as if coils having other sensitivities were present.

For data acquisition, well-known methods such as True-FISP can also be used for CAIPIRINHA. The difference lies in the number of acquired k-space lines and the sensitivity variation.

For acquisition of a three-dimensional volume, either three-dimensional data sets can be acquired. These have two phase encoding directions and their acquisition is time-consuming even when using parallel imaging. Or, for time-critical examinations, it is therefore preferable to acquire two-dimensional images in a plurality of slices. This is also known as multislice imaging. This type of data acquisition can also be speeded up using parallel imaging, cf. the remarks concerning MS-CAIPIRINHA.

In the case of spin echo methods, the slices can be acquired intermittently, i.e. one or more k-space lines of successive slices. This is repeated until a sufficient set of k-space lines is present in each slice.

Alternatively, each slice can also be acquired completely before the next follows. This is particularly the case for acquisition methods such as FLASH or TrueFISP or bSSFP (balanced steady state free precession).

The slices acquired in this way have therefore been acquired at different points in time. In the case of moving examination objects such as the heart or lung, the image data of the different slices are shifted relative to one another and must therefore be registered to one another in order to be able to create a 3D-image therefrom. For registration of the images, a high SNR is advantageous, for which reason bSSFP is preferred. However, with this type of data acquisition the achievable contrast is limited to the contrast obtained by means of bSSFP. This is a mixed contrast which depends on T1 and T2.

If the image data sets are to have other contrasts, it is possible, particularly in the case of moving examination objects, to register the scan signals using navigator echoes. However, the disadvantage of this is that the navigator echoes interrupt the sequence progression and the motion is characterized on the basis of few values, i.e. the characterization is prone to errors.

SUMMARY OF THE INVENTION

Proceeding from the above considerations, an object of the present invention is to provide a method for acquiring a data set which contains image data from multiple slices, that allows the image data sets can have different contrasts and slice registration is possible without additional complexity.

This object is achieved by a method of the type noted above, that includes the following steps.

A multiband radiofrequency (RF) pulse is radiated in a step (a) to excite at least two slices of a subject. The slices are phase encoded in a step (b) by applying a phase encoding gradient. The scan signals of the excited slices are read out (detected) in a step (c) using each coil of a multi-coil array. The phase of the scan signal in one of the steps (a) or (b) in at least one slice is modulated at least once in order to cause the phase of the scan signal of that at least one slice to be different from the phase of the other slices. Image data sets are reconstructed dependent on the modulation of the phase of the scan signal in at least one slice. The multiband radiofrequency pulse has, in at least one sequence of the steps (a) to (c), in at least one slice, a different amplitude and/or duration and/or pulse shape and/or deflection angle from the other slice or slices, wherein the deflection angle difference is other than 180°.

A core of the invention is the fact that not only the phase of the scan signal is changed, or rather modulated, in a slice, but also characteristics of the multiband radiofrequency pulse in the form of amplitude, pulse duration or pulse shape are changed or modulated. In the case of MS-CAIPIRINHA, a dual-band radiofrequency pulse for two slices is applied using the following phases:

|  | RF | | | | | | |
| --- | --- | --- | --- | --- | --- | --- | --- |
|  | 1 | 2 | 3 | 4 | 5 | 6 | ... |
| Slice 1 | X | X | X | X | X | X | ... |
| Slice 2 | X | –X | X | –X | X | –X | ... |

Whereas in slice 1 the radiofrequency pulse always deflects the spins in the same direction, here in the X-direction, in slice 2 the deflection takes place in the X- and –X-direction, i.e. with a 180° offset in each case.

This variation of the direction of deflection causes the phase of the scan signal of the second slice to be shifted relative to the phase of the scan signal of the first slice such that the image reconstructed from the scan signals of the second slice is shifted by half an FOV relative to the image from the first slice. This is advantageous particularly for evaluation using the SENSE reconstruction method, as the latter is applied to image data as described above.

The procedure just described is a known type of modulation of the phase of the scan signal according to feature (d) in claim 1 in the different slices. The phase of the scan signal in the second slice in step (a) is modulated by the deflection angle reversing in each slice by being inverted.

However, in the case of MS-CAIPIRINHA the amplitudes of the dual-band radiofrequency pulses in the slices remain the same, i.e. all the slices are acquired using the same imaging method, e.g. FLASH, TrueFISP, or similar.

Moreover, by additionally varying the amplitude and/or duration and/or pulse shape in the slices, it can be ensured that the image data sets have differing contrasts in the different slices. The multiband radiofrequency pulse, as the name suggests, consists of a plurality of bands, wherein each band excites one slice. Thus, for two slices, a dual-band radiofrequency pulse is used.

Alternatively, the phase of the scan signal can be modulated in at least one slice in step (b) by additionally applying a slice gradient during application of the phase encoding gradient. This varying of the phase is known as blipped CAIPIRINHA as described above.

If, in at least one sequence of the steps (a) to (c), in at least one slice, the multiband radiofrequency pulse has an amplitude and/or duration and/or pulse shape differing from the other slice or the other slices, the deflection angle difference can also be equal to 180°. The modulation then takes place as is known from MS-CAIPIRINHA and, in addition, by one of the possibilities mentioned, with particular preference to amplitude variation.

In one embodiment, the steps (a) to (c) are implemented repeatedly and phase modulation takes place at least once for each slice. Scan signals are therefore acquired repeatedly, i.e. at least twice, using each coil of the coil array. If the above phase cycle is applied, in the second slice a phase modulation takes place at every second acquisition compared to the first slice.

The total number of modulations depends on the number of acquisitions, i.e. acquisition windows, and this in turn on the number of coils in the coil array. What is important is that the phase schemes differ from one another at least once. Individual correspondences, even every second phase as above, are not a problem.

The additional variation of the amplitude and/or duration and/or pulse shape for each slice can take place once or repeatedly in this embodiment. For example, the multiband radiofrequency pulse can have a constant amplitude and therefore also a constant flip angle in a slice in order to obtain a FLASH image in that slice. In the other slices, completely different as well as identical amplitudes and flip angles can be used. Also the amplitudes do not have to be constant. Thus, in addition to a FLASH contrast, a mixed T1-T2* contrast can be produced in one slice, a T1 contrast or a T2 contrast, for example, in the other slices. Compared to the phase, for which no phase scheme is designed to be identical, it is only important, with regard to the amplitudes and/or durations and/or pulse shapes, that at least one slice be different from the others. The reason for this is that the phase information is required for reconstructing the image data, whereas the differences in amplitude, pulse duration or pulse shape only change the contrast of the images. However, the contrast can be the same in a number of slices.

In an alternative embodiment, the steps (a) to (c) can be implemented once, wherein the modulation of the phase of the slices is such that the phases of all the slices are different. This is achieved, for example, by the deflection angles of the multiband radiofrequency pulse in the slices being different. Because only one acquisition takes place with each coil, the variation of the amplitude and/or duration and/or pulse shape for each slice must also provide the variation for this one acquisition. As described, this relates only to the fact that at least one slice has a different contrast from the others. The deflection angle is also termed the RF phase.

The method can have more steps than the required steps. For example, rephasing or even spoiling of the scan signal can take place after readout of the signal.

The multiband radiofrequency pulse is preferably implemented as a dual-band radiofrequency pulse. Two slices are then excited simultaneously.

Preferably, the deflection angles of the multiband radiofrequency pulse for exciting at least one scan signal for at least two slices can also be different, wherein the difference is other than 180°. As described, an inverting excitation of the one slice is known from MS-CAIPIRINHA. It is proposed to provide, instead of an inversion, a deflection differing therefrom. This need not, as is also not the case with inversion, take place for each data acquisition, but at least once.

The difference between the deflection angles is preferably determined as a function of the number of slices. The greater the deflection angle difference, the greater the phase difference also. If another angle with maximum difference therebetween is desired for each slice, 360° is divided by the number of slices.

Preferably, the image data sets are reconstructed using a GRAPPA reconstruction method or a SENSE reconstruction method. As described in the introduction, SENSE is applied to partially reconstructed image data, whereas GRAPPA is used to reconstruct k-space lines. Image data sets of the different slices are obtained as the result of the reconstruction.

Particularly advantageously, the deflection angle, amplitude, duration and pulse shape of the multiband radiofrequency pulse can be selected such that at least one reconstructed image data set has an SSFP contrast, in particular a bSSFP contrast. This can only mean that a band of the multiband radiofrequency pulse has a sequence of $\alpha$ and $-\alpha$ flip angles. Variations such as HEFEWEIZEN, cf. Halting the Effects of Flow Enhancement With Effective Intermittent Zeugmatographic Encoding (HEFEWEIZEN) in SSFP: Jamal J. Derakhshan, B S, Mark A. Griswold, Jeffrey L. Sunshine, and Jeffrey L. Duerk, J of Magn. Res. Imag. 29, 1163-1174, 2009, can also be used.

Additionally, the phase, amplitude, duration and pulse shape of the multiband radiofrequency pulse or rather of a band of the multiband radiofrequency pulse can be selected such that at least one reconstructed image data set has a T2 contrast. The band of the multiband radiofrequency pulse is set accordingly for that slice. The band of a slice or the bands of a number of slices preferably have a non-zero amplitude only in some cases, in particular for one or more but not every application of the multiband radiofrequency pulse. This is a way to ensure that the image data sets produced from these slices has a T2 contrast.

Alternatively or additionally, at least one reconstructed image data set can have a T1 contrast. Instead of a sequence of $\alpha$ and $-\alpha$ flip angles, in particular 0° and 180° sequences, a quadratic variation of the phase of the band or bands of the respective slices can be set. Thus an (RF) spoiled SSFP and therefore a T1 contrast can be obtained.

As a further alternative or in addition, the phase, amplitude, duration and pulse shape of the multiband radiofrequency pulse can be selected such that at least one reconstructed image data set has a spin density contrast.

Advantageously, one or more slices can be prepared, in particular saturated or inverted, using a radiofrequency pulse or a radiofrequency pulse train. A multiband radiofrequency pulse does not have to be used, the preparation can be performed one or more times. It can take place prior to step (a) or, instead of readout of the signal, a preparation is performed in this time interval, as occurs with HEFEWEIZEN mentioned above.

Slice-specific preparation can also be achieved by the first pulse exciting all the slices and a second pulse reversing the effect of the first pulse in one or more, in particular the first slice.

The slice having the SSFP contrast or rather the highest SNR can also be shifted. The other slice can bounce around this slice, resulting in a spin density contrast. Alternatively, the slices can be shifted from excitation to excitation by changing the slice gradient applied during the multiband radiofrequency pulse, wherein the change in position is less than the slice thickness, in particular less than 20% of the slice thickness.

The resolution in the slice direction can be set in the bands by means of different pulse shapes and amplitudes.

The number of acquired k-space lines which are used for final image reconstruction can also differ from slice to slice. This is possible in the case of the acquisition of so-called interleaved encoding. This makes the processing of the scan signals more variable. The tradeoff between temporal resolution and SNR and spatial resolution can thus be selected slice-selectively.

The scan signals can also undergo postprocessing methods such as baseline correction, zero filling, etc.

The number of thus-acquired image data sets also constitute a multislice data set. This includes at least two simultaneously acquired image data sets.

The invention also relates to a method for registering two multislice data sets each comprising at least two image data sets. The multislice data sets have been produced as described. The registration is characterized in that a slice of the multislice data set is selected in each case and the multislice data sets are registered using the slices selected.

The multislice data sets are preferably acquired using identical acquisition parameters so that they differ only in respect of the acquisition instant. This is helpful particularly in the case of moving examination objects. Any differences in the image data sets used for registration result from the movement of the examination object. The other slices are automatically co-registered, as they are in a fixed known space-time relationship.

Using the described method for producing at least two image data sets it is thus possible to create an image data set such that it has a first contrast, or more specifically has a higher SNR than the other and is thus optimized for registration, whereas the other image data set or sets represent a predetermined contrast which is relevant in particular to clinical issues. Because the slices are acquired in parallel/simultaneously, the problems associated with other registration methods are avoided.

A slice that is scanned at a fixed, optimum position for navigation can advantageously be selected as a navigation slice.

As stated above, the scan parameters of the multislice data sets to be optimized are optimally identical. The slices then also lie identically, relative to the magnetic resonance system. The examination object is moving, which means that the position of the slices shifts relative thereto. Otherwise registration would be unnecessary. With particular preference, the slice position or slice having the highest signal-to-noise ratio in the multislice data sets is selected as the slice for registration. If a slice having an SSFP or bSSFP contrast is acquired, this is usually the slice having the highest SNR or CNR, which is the reason why it is used for registration.

The slices can be registered using elastic or rigid methods. Registration can be limited to in-plane movements, to 3D movements, can contain a time component, and can contain selection of sub-data sets.

The object underlying the present invention is also achieved by a magnetic resonance apparatus that has a multi-coil array and a control device for implementing the methods as described.

The above mentioned methods can be implemented in the control device as software or as (hardwired) hardware.

Embodiments of the magnetic resonance system equate to corresponding embodiments of the inventive methods.

BRIEF DESCRIPTION OF THE DRAWINGS

FIG. 1 shows a magnetic resonance system having a multi-coil array.

FIG. 2 is a flowchart for the acquisition of a multislice data set.

FIG. 3 shows a dual band radiofrequency pulse having two bands.

FIG. 4 is a sequence diagram in a first embodiment of the method according to the invention.

FIG. 5 shows a sequence diagram in a second embodiment of the method according to the invention.

DESCRIPTION OF THE PREFERRED EMBODIMENTS

Figure 6:
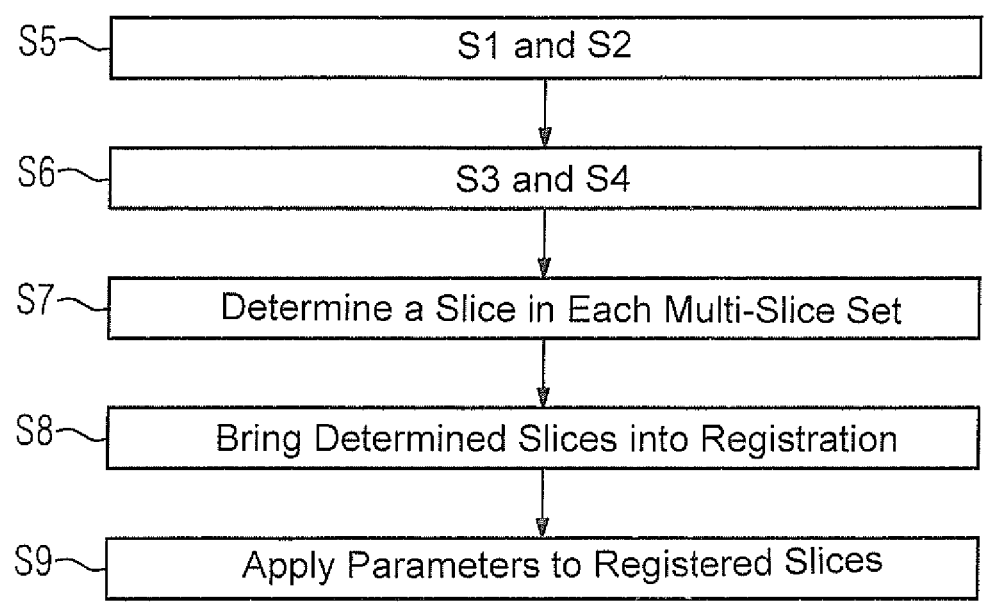
FIG. 6 is a flowchart for the registration of two multislice data sets.

FIG. 1 shows a magnetic resonance apparatus 1 having a radiofrequency (RF) coil 2 and a coil array 3 that includes coils 4, 5, 6 and 7, and a control device 8.

The coil 2 is usually a so-called body coil. This is used to excite the magnetization. The coil array 3 is also used for reading out (detecting) the scan signal. Multiple coils among coils 4, 5, 6 and 7 read the scan signal out simultaneously. The different sensitivities of the coils 4, 5, 6 and 7 can be taken into account for reconstructing the acquired scan signals.

FIG. 2 shows a flowchart for the generation of two parallel two-dimensional image data sets of a region of interest. The corresponding slices are shown in FIG. 3.

As schematically shown in FIG. 3, in step S1 a dual band radiofrequency (RF) pulse 9 is applied in order to excite spins in two separate slices 10 and 11. The first band 12 for exciting the first slice 10 has a first pulse phase, amplitude, pulse shape and pulse duration. The second band 13 has a second pulse phase, amplitude, pulse shape and pulse duration. The pulse phase stands for the deflection angle of the band 12 or 13 of the respective dual band radiofrequency pulse 9, i.e. X, −X, Y or −Y, for example. The deflection angle is not to be confused with the flip angle which describes not the direction but the size of the deflection.

The slices 10 and 11 of the multislice data set 14 are aligned parallel and have a predefinable slice-to-slice separation 15 and predefinable slice thicknesses 16 and 17.

In step S2 a phase encoding gradient for phase encoding of the slices 10 and 11 is applied. The coil array 3 is used to reduce the number of steps S2, i.e. of phase encoding steps.

This is followed as step S3 by readout of the scan (MR) signals of the excited slices 10 and 11 using each coil 4, 5, 6, and 7 of the coil array 3.

Finally, in step S4 the signal acquired using the coil array 3 is reconstructed into two image data sets. Reconstruction methods such as GRAPPA or SENSE can be used for this purpose.

In order to be able to separate also closely adjacent slices 10 and 11 having a small slice-to-slice separation 15, the phase of the slices 10 and 11 is differentially modulated by additional measures. The steps S1 to S3 described above produce an image that corresponds to an image having a large slice thickness, i.e. it is a sum of the actually separately required image data.

After readout of the scan signal, spoiling or rephasing of the scan signal can be performed as another part of step S3.

The pulse phase either of the first band 12 and/or of the second band 13 can be subject to a phase cycle. Examples of this are the phase cycles known as PAPS, CYCLOPS or EXORCYCLE.

The steps S1 to S3 are repeated several times, as indicated by the arrow 18. For each repetition, the pulse phases of the first band 12 and of the second band 13 are set as required.

Alternatively, a modulation as described in connection with blipped CAIPIRINHA can be used.

FIG. 4 shows a sequence diagram for the acquisition of the scan signals from two slices 10 and 11 whereby the image data set determined from the scan signals of the slice 10 has a bSSFP contrast and the image data set determined from the scan signals of the slice 11 has a spin density contrast.

The axes 19, 20, 21 and 22 represent a time sequence, the axis 19 for the second band 13, the axis 20 for the slice gradient and the first band 12, the axis 21 for the read direction and the axis 22 for the acquisition windows.

The amplitude of the second band 13 is initially set to zero in order to achieve a steady state in the first slice 10 by the first band 12. The individual pulses 23 and 24 of the first band 12 have flip angles with inverting deflection angles, generally denoted by α and −α. For clarity, only the left half of the image is provided with a reference character, the designation in the right half being the same.

The pulses 25, 26, 27, 28, and 29 of the second band 13 have increasing amplitudes in the course of the scan. If the pulses 25 to 29 are applied during the diastole of a cardiac cycle, a particularly good spin density contrast is produced.

The number of acquisition windows 30 depends on the number of k-space lines to be acquired. This is in turn limited, among other things, by the number of coils in the coil array 3.

The switching (activation) of the slice gradient 31 and of the read gradient 32 are essentially well-known and thus need not be explained in greater detail herein.

In order to achieve reconstructive separation of the slices 10 and 11 in the sequence according to FIG. 4, as described a phase cycle as in MS-CAIPIRINHA or a slice gradient 31 during the read gradient 32 as in BLIPPED CAIPIRINHA can be used.

The diversity of the amplitudes of the pulses 23 and 24 of the first band 12, and of the pulses 25 to 29 of the second band 13, helps to obtain two image data sets having different contrasts.

FIG. 5 shows an alternative embodiment of a sequence diagram for the acquisition of scan signals from two slices 10 and 11 in which the image data set determined from the scan signals of the slice 10 has a bSSFP contrast and the image data set determined from the scan signals of the slice 11 has a T1 contrast.

The axis 33 shows the time characteristic of the phase gradient 34 which is also present thus in the sequence according to FIG. 4 but not shown. The essential difference compared to FIG. 4 lies in the pulse 35 of the second band 13 which is either a 90° saturation pulse or a 180° inversion pulse. Because of the pulse 35, the magnetization in the slice 11 relaxes longitudinally from the inversion or zero position, thereby producing a T1 contrast in this slice.

Although this is not explicitly shown in the FIGS. 4 and 5, the bands 12 and 13 and the respective pulses are parts of the dual-band radiofrequency pulse 9. Instead of two independent radiofrequency pulses, one dual band radiofrequency pulse 9 is used.

FIG. 6 shows a flow chart for the registration of two multislice data sets 14 which have preferably been acquired using identical acquisition parameters on a moving examination object. This can be a heart or a lung, for example. In particular, it can therefore be a periodically moving examination object.

In steps S5 and S6, the examination object is imaged using a method comprising the steps S1 to S4. One therefore has two multislice data sets 14 at different points in time particularly in the periodic movement. Instead of two, any number of multislice data sets 14 can be acquired.

As step S7, the image data sets associated with the slices 10 are determined from the multislice data sets 14 and registered to one another in step S8. For example, an image data set acquired during diastole of the cardiac cycle is used as a reference image data set and used to calculate shift or rotation parameters with respect to every other image data set.

As step S9, these parameters are applied to the image data sets of both the slice 10 and the slice 11. This is possible, as the slices 10 and 11 are permanently linked to one another and are therefore moved as one.

As a result of the different contrasts in the image data sets of the slices 10 and 11, the image data sets of the slice 11 can be registered to one another even if their image contrasts do not allow it at all.

This contrast difference is possible due to the different amplitudes in the bands 12 and 13 of the multiband radiofrequency pulse 9. The procedure shown is not limited to two slices 10 and 11, rather any number of slices can be acquired.

A single slice or rather the image data produced from the signals of the slice can have a high contrast, in particular a bSSFP contrast, whereas all the other slices have T1 or spin density contrasts.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating at least two parallel two-dimensional image data sets of an examination object by operation of a magnetic resonance data having a multi-coil array and a gradient coil arrangement, said method comprising:
   (a) operating said multi-coil array to radiate a multiband radiofrequency pulse while the examination object is situated in the magnetic resonance scanner, and thereby exciting nuclear spins in at least two slices, thereby causing magnetic resonance signals to be emitted from said at least two slices;
   (b) operating the gradient coil arrangement to activate a phase encoding gradient that phase encodes said at least two slices and thus phase encodes said MR signals;
   (c) operating said gradient coil arrangement and said multi-coil array to read out the MR signals from said at least two slices, using each coil of said multi-coil array to receive said MR signals;
   (d) operating said magnetic resonance scanner to modulate a phase of said MR signals by, when modulating the phase of said MR signals in (a), operating said multi-coil array to produce a different deflection angle in each of said at least two slices, and when modulating the phase of said MR signals in (b), operating said gradient coil arrangement to activate a slice gradient during activation of said phase encoding gradient in at least one of said at least two slices, thereby making the modulated phase of said MR signals of said at least one of said at least two slices different from the phase of MR signals from all other slices of the examination object;
   (e) operating said multi-coil array, in at least one sequence of (a), (b) and (c), to give said multiband radiofrequency pulse, in at least one slice of said at least two slices, at least one of an amplitude that differs from an amplitude in other slices, a pulse shape that differs from a pulse shape in other slices, and a deflection angle that differs from a deflection angle in other slices by an amount other than 180°; and
   (f) providing said MR signals to a computer and, in said computer, executing an image reconstruction algorithm to reconstruct an image of said at least two slices of the examination subject depending on said modulation of said phase of said MR signals in said at least one slice of said at least two slices.

2. A method as claimed in claim 1 comprising repeating (a), (b) and (c) multiple times, with said phase modulation being implemented for different slices in respective repetitions, in order to implement said phase modulation at least once for each slice.

3. A method as claimed in claim 1 comprising executing (a), (b) and (c) only once, and implementing said modulation of said phase to make the respective phase of the MR signals from each slice different.

4. A method as claimed in claim 1 comprising repeating (a), (b) and (c) multiple times, and reading out said MR signals only in each nth repetition of (c), wherein n is an integer that is greater than or equal to two, and in all other repetitions implementing preparation of at least one of said slices.

5. A method as claimed in claim 1 comprising determining said deflection angle difference of a function of the number of said at least two slices.

6. A method as claimed in claim 1 comprising, in said computer, selecting said reconstruction algorithm from the group consisting of a GRAPPA reconstruction algorithm and a SENSE reconstruction algorithm.

7. A method as claimed in claim 1 comprising operating said multi-coil array to give said multiband radiofrequency pulse a phase, amplitude, duration and pulse shape selected to cause at least one reconstructed image to have an SSFP contrast.

8. A method as claimed in claim 7 wherein said SSFP contrast is a bSSFP contrast.

9. A method as claimed in claim 1 comprising operating said multi-coil array to give said multiband radiofrequency pulse a phase, amplitude, duration and pulse shape selected to cause at least one reconstructed image to have a T2 contrast.

10. A method as claimed in claim 1 comprising operating said multi-coil array to give said multiband radiofrequency pulse a phase, amplitude, duration and pulse shape selected to cause at least one reconstructed image to have a T1 contrast.

11. A method for bringing at least two multislice image data sets into registration with each other, said at least two multislice image data sets each comprising at least two image data sets of an examination object acquired by operation of a magnetic resonance scanner having a multi-coil array and a gradient coil arrangement, said method comprising:
   (a) operating said multi-coil array to radiate a multiband radiofrequency pulse while the examination object is situated in the magnetic resonance scanner, and thereby exciting nuclear spins in at least two slices, thereby causing magnetic resonance signals to be emitted from said at least two slices;
   (b) operating the gradient coil arrangement to activate a phase encoding gradient that phase encodes said at least two slices and thus phase encodes said MR signals;
   (c) operating said gradient coil arrangement and said multi-coil array to read out the MR signals from said at least two slices, using each coil of said multi-coil array to receive said MR signals;

(d) operating said magnetic resonance scanner to modulate a phase of said MR signals by, when modulating the phase of said MR signals in (a), operating said multi-coil array to produce a different deflection angle in each of said at least two slices, and when modulating the phase of said MR signals in (b), operating said gradient coil arrangement to activate a slice gradient during activation of said phase encoding gradient in at least one of said at least two slices, thereby making the modulated phase of said MR signals of said at least one of said at least two slices different from the phase of MR signals from all other slices of the examination object;

(e) operating said multi-coil array, in at least one sequence of (a), (b) and (c), to give said multiband radiofrequency pulse, in at least one slice of said at least two slices, at least one of an amplitude that differs from an amplitude in other slices, a pulse shape that differs from a pulse shape in other slices, and a deflection angle that differs from a deflection angle in other slices by an amount other than 180°;

(f) providing said MR signals to a computer and, in said computer, executing an image reconstruction algorithm to reconstruct an image data set for each of said at least two with slice data sets depending on said modulation of said phase of said MR signals in said at least one slice of said at least two slices; and (g) in said computer, selecting a slice of each multislice image data sets and bringing the multislice image data sets into registration using the respective, selected slices of each multislice image data sets.

12. A method as claimed in claim 11 comprising selecting a slice, as said selected slice, in each of said multislice data sets that is in a same position in each of said multislice data sets, with the selected slice in each multislice data set being a slice having a highest signal-to-noise ratio in the respective multislice data sets.

13. A magnetic resonance apparatus comprising:
a magnetic resonance scanner comprising a multi-coil array and a gradient coil arrangement;
a control computer configured to:

(a) operate said multi-coil array to radiate a multiband radiofrequency pulse while the examination object is situated in the magnetic resonance scanner, and thereby exciting nuclear spins in at least two slices, thereby causing magnetic resonance signals to be emitted from said at least two slices, (b) operate the gradient coil arrangement to activate a phase encoding gradient that phase encodes said at least two slices and thus phase encodes said MR signals, (c) operate said gradient coil arrangement and said multi-coil array to read out the MR signals from said at least two slices, using each coil of said multi-coil array to receive said MR signals, (d) operate said magnetic resonance scanner to modulate a phase of said MR signals by, when modulating the phase of said MR signals in (a), operate said multi-coil array to produce a different deflection angle in each of said at least two slices, and when modulating the phase of said MR signals in (b), operate said gradient coil arrangement to activate a slice gradient during activation of said phase encoding gradient in at least one of said at least two slices, thereby making the modulated phase of said MR signals of said at least one of said at least two slices different from the phase of MR signals from all other slices of the examination object;

(e) operate said multi-coil array, in at least one sequence of (a), (b) and (c), to give said multiband radiofrequency pulse, in at least one slice of said at least two slices, at least one of an amplitude that differs from an amplitude in other slices, a pulse shape that differs from a pulse shape in other slices, and a deflection angle that differs from a deflection angle in other slices by an amount other than 180°; and an image reconstruction computer provided with said MR signals, said image reconstruction computer being configured to execute an image reconstruction algorithm to reconstruct an image of said at least two slices of the examination subject depending on said modulation of said phase of said MR signals in said at least one slice of said at least two slices.

* * * * *